(12) United States Patent
Ma et al.

(10) Patent No.: US 10,586,791 B2
(45) Date of Patent: Mar. 10, 2020

(54) ADAPTIVE THERMAL OVERSHOOT AND CURRENT LIMITING PROTECTION FOR MOSFETS

(71) Applicant: TEXAS INSTRUMENTS INCORPORATED, Dallas, TX (US)

(72) Inventors: Qingjie Ma, Shanghai (CN); Wei Xu, Jiangsu (CN); Jingwei Xu, Plano, TX (US); Yang Wang, Shanghai (CN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/035,007

(22) Filed: Jul. 13, 2018

(65) Prior Publication Data

US 2019/0279977 A1    Sep. 12, 2019

Related U.S. Application Data

(63) Continuation of application No. PCT/CN2018/078444, filed on Mar. 8, 2018.

(51) Int. Cl.
*H03K 17/0812*  (2006.01)
*H01L 27/02*  (2006.01)
(Continued)

(52) U.S. Cl.
CPC ... *H01L 27/0277* (2013.01); *H03K 17/08104* (2013.01); *H03K 17/08122* (2013.01); *H03K 2017/0806* (2013.01)

(58) Field of Classification Search
CPC .......... H01L 27/0277; H03K 17/08104; H03K 17/08122; H03K 2017/0806; H03K 17/0812; H03K 17/08; H03K 17/0822
See application file for complete search history.

(56) References Cited

U.S. PATENT DOCUMENTS 4,893,158 A * 1/1990 Mihara ............... H01L 27/0251
257/341
6,930,870 B2 * 8/2005 Nobe .................. H01L 27/0251
361/103
(Continued)

FOREIGN PATENT DOCUMENTS

EP      0927920 A1    7/1999
JP    2002111480 A    4/2002

OTHER PUBLICATIONS

Attachment 12, Short Circuit Reliability Characterization of Smart Power Devices for 12V Systems. Sep. 14, 2006, AEC-Q100-012-rev-, Accessed Feb. 22, 2016 http://www.aecouncil.com/AECDocuments.html.
(Continued)

*Primary Examiner* — Jung Kim
(74) *Attorney, Agent, or Firm* — Lawrence J. Bassuk; Charles A. Brill; Frank D. Cimino

(57) ABSTRACT

In a described example, an apparatus includes: a first metal oxide semiconductor field effect transistor (MOSFET) coupled between a first input terminal for receiving a supply voltage and an output terminal for coupling to a load, and having a first gate terminal; an enable terminal coupled to the first gate terminal for receiving an enable signal; a first current mirror coupled between the first input terminal and a first terminal of a first series resistor and having an input coupled to the first gate terminal; and a second MOSFET coupled between the first gate terminal and the output terminal, and having a second gate terminal coupled to the first terminal of the first series resistor, the first series resistor having a second terminal coupled to the output terminal.

20 Claims, 5 Drawing Sheets

(51) Int. Cl.
    *H03K 17/081*    (2006.01)
    *H03K 17/08*     (2006.01)

(56) References Cited

U.S. PATENT DOCUMENTS

| | | |
|---|---|---|
| 8,154,346 B2 | 4/2012 | Tung |
| 2003/0169025 A1 | 9/2003 | Finney |
| 2011/0018621 A1* | 1/2011 | Butzmann ............... G05F 3/262 327/543 |
| 2018/0048140 A1 | 2/2018 | Takuma |

OTHER PUBLICATIONS

International Search Report dated Dec. 6, 2018.

\* cited by examiner

CYCLE CAPABILITY GRADES

| GRADE | # CYCLES | LOTS/SAMPLES PER LOT | # FAILS |
|---|---|---|---|
| A | >1,000,000 | 3/10 | 0 |
| B | >300,000 - 1,000,000 | 3/10 | 0 |
| C | >100,000 - 300,000 | 3/10 | 0 |
| D | >30,000 - 100,000 | 3/10 | 0 |
| E | >10,000 - 30,000 | 3/10 | 0 |
| F | >3,000 - 10,000 | 3/10 | 0 |
| G | >1,000 - 3000 | 3/10 | 0 |
| H | 300 - 1,000 | 3/10 | 0 |
| O | < 300 | 3/10 | 0 |

ADAPTIVE THERMAL OVERSHOOT AND CURRENT LIMITING PROTECTION FOR MOSFETS

TECHNICAL FIELD

This disclosure relates generally to switched power electronics, and more particularly to switched power electronics with thermal and current limit protection.

BACKGROUND

Power metal oxide semiconductor field effect transistor (MOSFET) devices are transistors specifically arranged to operate with high voltages from drain to source (high breakdown voltage BVds) and to carry currents and provide voltage from a voltage supply to a load. A power MOSFET can operate safely with tens or hundreds of volts from drain to source in the off state. Power MOSFETs are manufactured to have relatively low on-resistance so that when the device is active and operating to carry current, the voltages at the drain and source are very close to one another, and the power from the voltage supply at the source of the power MOSFET is efficiently coupled to the output terminal at the drain of the power MOSFET. Vertical devices such as VMOS devices and double-diffused devices such as DMOS transistors can be used as power MOSFETs. Lateral low resistance transistors such as LDMOS transistors can be used as power MOSFETs. The power MOSFET devices are physically larger than logic or control circuit transistors on an integrated circuit, because those devices do not carry current to the load and can be made much smaller. In switched power systems using power MOSFET transistors to deliver current and voltage to a load, an inrush current or short circuit current causes the power MOSFET to heat. Inrush current can increase when the output terminal supplied by a power MOSFET is temporarily shorted to ground, for example. Over-temperature protection arrangements within an integrated circuit including a power MOSFET device can reduce the current flowing through the power MOSFET device or shut off the power MOSFET to protect the power MOSFET from damage. However, sudden high load current also causes a rapid spike in the MOSFET temperature which can degrade the semiconductor device even after the thermal protection is enabled. In multi-channel power MOSFET devices, such as a multiple channel high side driver (HSD) device, the heat generated at a first MOSFET location on a semiconductor device can spread to an adjoining second MOSFET location on the same semiconductor device, the second MOSFET may experience elevated temperatures resulting in the thermal protection being enabled at the second MOSFET. However, when the thermal event at the first location causes a spike in temperature, the thermal protection at the second site may not act rapidly enough to prevent thermal degradation of the MOSFET at the adjoining, second location.

The repeated occurrence of over-heating has a detrimental effect on the life of the HSD devices. In response to this issue, for HSDs used in automotive systems, the AEC (Automotive Electronic Council) promulgates specification AEC-Q100-012 to address and grade the reliability of "smart" HSD devices containing control circuitry and one or more power MOSFET devices in a single IC. Within the AEC specification, a standard test bench and grading table for HSD devices is published with the highest reliability (grade A) for HSD devices completing more than one million test cycles without device failure and the lowest reliability (grade O) for HSD devices completing less than three hundred test cycles. During a test cycle, the output is coupled to ground repeatedly to determine the reliability of the device.

SUMMARY

In a described example, an apparatus includes: a first metal oxide semiconductor field effect transistor (MOSFET) coupled between a first input terminal for receiving a supply voltage and an output terminal for coupling to a load, and having a first gate terminal; an enable terminal coupled to the first gate terminal for receiving an enable signal; a first current mirror coupled between the first input terminal and a first terminal of a first series resistor and having an input coupled to the first gate terminal; and a second MOSFET coupled between the first gate terminal and the output terminal, and having a second gate terminal coupled to the first terminal of the first series resistor, the first series resistor having a second terminal coupled to the output terminal.

DETAILED DESCRIPTION

Corresponding numerals and symbols in the different figures generally refer to corresponding parts unless otherwise indicated. The figures are not necessarily drawn to scale. The term "coupled" may include connections made with intervening elements, and additional elements and various connections may exist between any elements that are "coupled."

As noted hereinabove, the AEC-Q100-012 test is used to grade the reliability of high side drivers (HSD) integrated circuits containing power MOSFETS in short circuit conditions. There are three test conditions in the AEC specification. The first test condition is titled "Cold Repetitive Short Circuit Test—Short Pulse". The term "cold" means that the DUT (device under test, in this case a HSD) can cool to the specified test temperature between test cycles. The term "short pulse" indicates that the DUT output is shorted until the DUT thermal protection indicates a thermal issue, plus an additional delay of 10 mS, then the test short is removed.

The second AEC test is titled "Cold Repetitive Short Circuit Test—Long Pulse". "Cold" refers to allowing the DUT to cool to the specified test temperature between test pulses. "Long pulse" indicates that the DUT output is shorted until the DUT thermal protection indicates a thermal issue plus an additional 300 mS, then the test short is removed.

The third AEC test is titled "Hot Repetitive Short Circuit Test". "Hot" refers to the test condition where test pulses repeat and the DUT is not allowed to cool between pulses. A DUT in this test will operate near the thermal shut off point and the test set issues additional pulses as soon as the DUT auto-reset activates. "Short Circuit" means the output is shorted to ground.

Figures 1A, 1B:
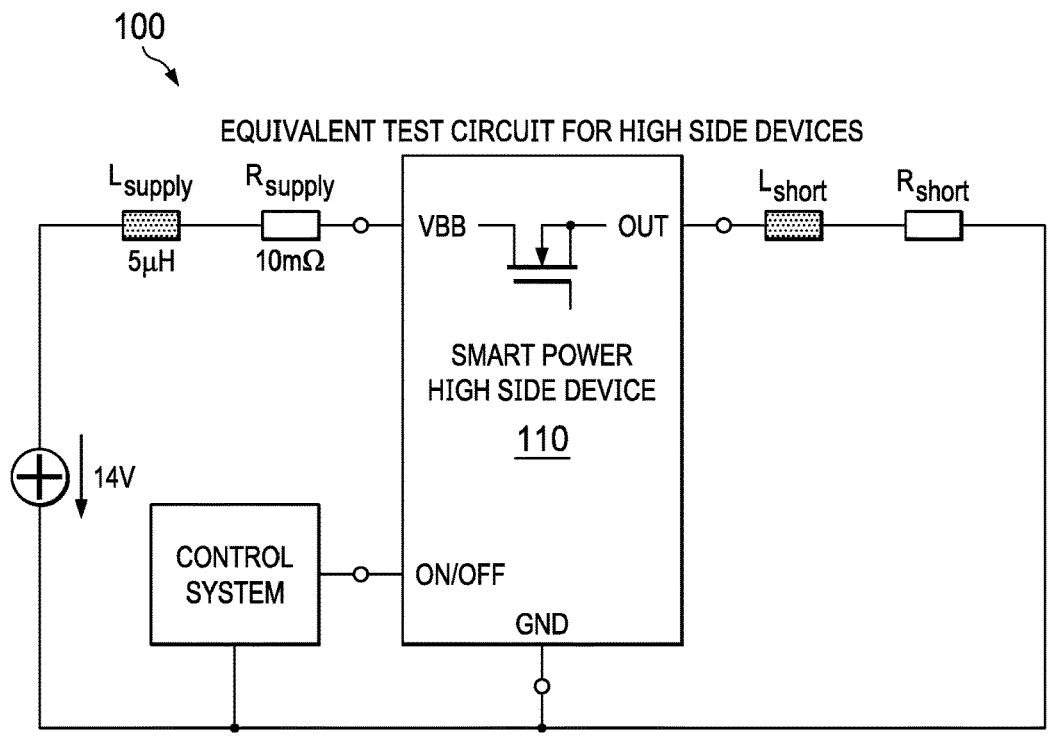
FIGS. 1A-1B are a schematic of the AEC test bench and a corresponding device grading table, respectively

FIG. 1A, 1B are a schematic of the AEC test bench and a grading table, respectively. FIG. 1A is a reprint of the AEC-Q100-12 test bench schematic for a high side driver (HSD). The device under test (DUT) 110 is cycled by the control system based on the three test descriptions hereinabove. Table 102 is a reprint of the test cycle grading table used for rating devices tested on the test bench 100.

Example arrangements provide an HSD design that achieves improved reliability. In one aspect, example arrangements include a fast current limit detection apparatus that detects rapidly rising current (such as when the output terminal supplied by a high side driver is shorted to ground) and proactively attenuates the gate voltage of the power MOSFET, slowing the substrate temperature rise, thereby preventing thermal overshoot of the peak temperature limit. In another aspect some arrangements monitor a difference in temperature between a power FET and the temperature of the bulk IC that includes the power FET, and the gate signal of a power MOSFET is modulated when the temperature of the power FET (or one of the power MOSFETs when multiple channels are present on a single HSD IC) exceeds a thermal limit. The modulation of the gate signal results in a slowing of the rate of thermal rise, preventing a thermal overshoot before thermal shutdown. In another aspect an arrangement uses an adaptive strategy to lower a peak operating temperature limit when a power MOSFET is operating at or above a peak current limit. By reducing the peak operating temperature limit when the device is at a peak current condition, thermal overshoot is avoided or reduced. In an example arrangement, the combination of these aspects results in a HSD device capable of achieving an A grade in AEC-Q100-012 testing.

Figure 2:
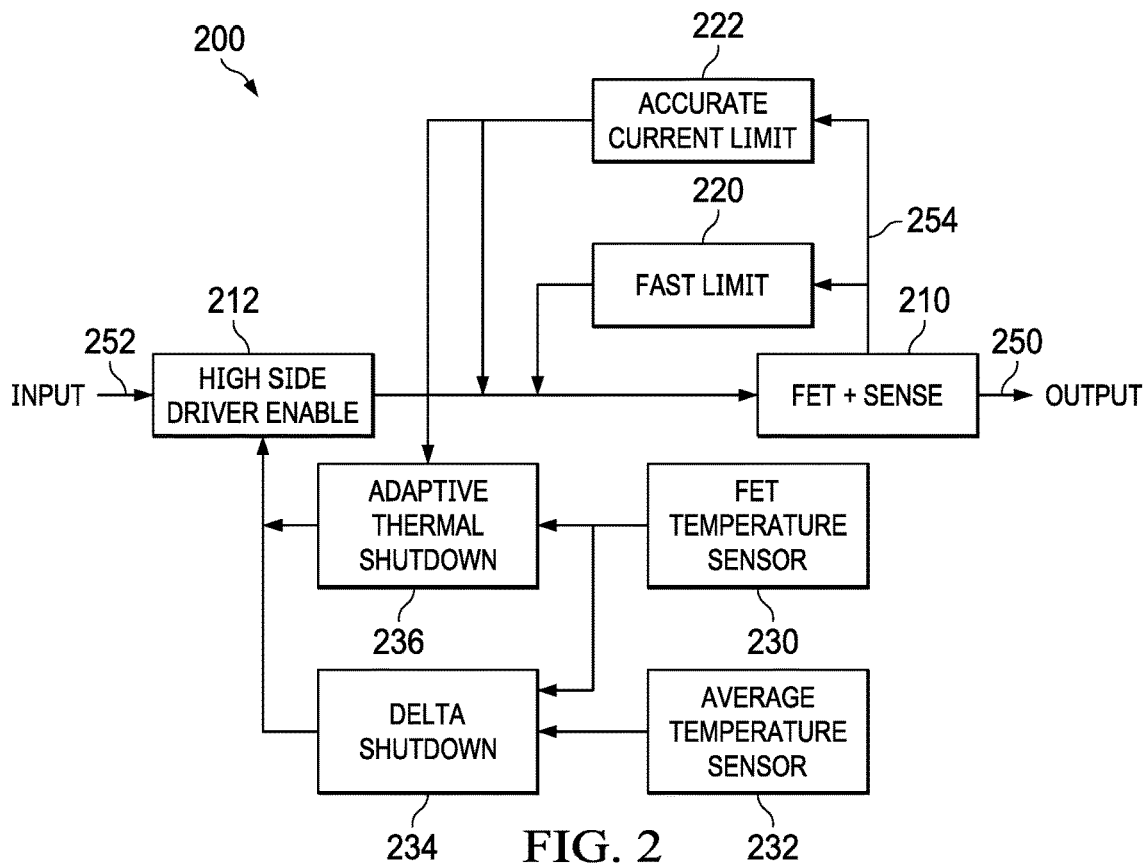
FIG. 2 is a block diagram of an example arrangement for a single switch high side driver with thermal and current limit protections.

FIG. 2 is a block diagram of an example arrangement for a single channel high side driver integrated circuit (HSD IC) 200 with thermal protection. There are eight blocks in HSD 200: FET+SENSE 210 (including a power MOSFET and output current sense circuitry); HIGH SIDE DRIVER ENABLE; FET TEMPERATURE SENSOR 230 (MOSFET temperature sensor); AVERAGE TEMPERATURE SENSOR 232; DELTA SHUTDOWN 234; ADAPTIVE THERMAL SHUTDOWN 236; ACCURATE CURRENT LIMIT 222 and FAST LIMIT 220. In an example, the blocks in FIG. 2 are implemented on a single HSD integrated circuit. In another example, some of the protection blocks can be omitted while the remaining protection blocks increase performance of the system.

The block FET+SENSE 210 has an input coupled to the block HIGH SIDE DRIVER ENABLE 212, and has outputs coupled to ACCURATE CURRENT LIMIT 222 and FAST LIMIT 220. The FET+SENSE 210 also has three outputs: Output 250 coupled for supplying current to a load (not shown); a current sense output coupled to FAST LIMIT 220 and a current sense output coupled to ACCURATE CURRENT LIMIT 222. At least one power MOSFET is within the block FET+SENSE 210. The HIGH SIDE DRIVER ENABLE 212 has three inputs: Input 252 for receiving an external input signal; an input coupled to DELTA SHUTDOWN 234 and an input coupled to ADAPTIVE THERMAL SHUTDOWN 236. The block ADAPTIVE THERMAL SHUTDOWN 236 has inputs from ACCURATE CURRENT LIMIT 222 and FET TEMPERATURE SENSOR 230. The DELTA SHUTDOWN 234 block has inputs from FET TEMPERATURE SENSOR 230 and AVERAGE TEMPERATURE SENSOR 232.

In steady state operation, a power MOSFET within the block FET+SENSE 210 is enabled to conduct current responsive to an output of HIGH SIDE DRIVER ENABLE 212. Current flows from a voltage supply (not shown) through the block FET+SENSE 210 to the Output 250 where a load (not shown) is coupled. The output current is monitored by FAST LIMIT 220 and by ACCURATE CURRENT LIMIT 222. The temperature of the power MOSFET within the FET+SENSE 210 is monitored by the FET TEMPERATURE SENSOR 230. The average IC temperature is monitored by AVERAGE TEMPERATURE SENSOR 232.

In a first example arrangement, a fast-current limit protects the power MOSFET from current overshoot. Current overshoot can reduce the life of the power MOSFET. When a short circuit or inrush current causes a rapid current rise, the FAST LIMIT 220 block directly attenuates a gate voltage to the power FET in FET+SENSE 210, or shuts off the gate voltage of the power MOSFET within the block FET+SENSE 210 to protect the power MOSFET from peak current overshoot.

In another example arrangement, a thermal swing apparatus protects a power MOSFET from thermal overshoot. In the event of rapidly rising MOSFET temperature, the block DELTA SHUTDOWN 234 monitors a temperature difference (delta) between the power MOSFET temperature and the average IC temperature. The DELTA SHUTDOWN 234 monitors temperatures using sensors in the FET TEMPERATURE SENSOR 230 and AVERAGE TEMPERATURE SENSOR 232 blocks, respectively. When the delta or temperature difference exceeds a threshold value, such as 60 degrees Celsius, the power MOSFET current conduction is reduced by modulating the gate signal from HIGH SIDE DRIVER ENABLE 212. After the temperature difference between FET TEMPERATURE SENSOR 230 and AVERAGE TEMPERATURE SENSOR 232 drops below the threshold to a lower hysteretic temperature difference, such as when the FET TEMPERATURE SENSOR 230 cools by 10 degrees C., the DELTA SHUTDOWN 234 restores full control of the HIGH SIDE DRIVER ENABLE 212 by INPUT 252. The monitoring of the temperature delta and the modulation of the gate signal to the power MOSFET reduces or eliminates fast thermal transient stress on the power MOSFET.

In another example arrangement, an adaptive thermal threshold protects the power MOSFET from thermal stress and from thermal overshoot. Block FET TEMPERATURE SENSOR 230 senses the temperature of the power MOSFET within the block FET+SENSE 210. In the example arrangement a thermal limit for taking thermal action adapts to potential thermal conditions on the integrated circuit. The thermal limit is adapted based on the current limit within the ACCURATE CURRENT LIMIT 222 block. When the load current exceeds a load current threshold as determined by the ACCURATE CURRENT LIMIT 222 block, the thermal limit is lowered, such as by 10 degrees Celsius, by the block ADAPTIVE THERMAL SHUTDOWN 236. Lowering the thermal limit can reduce or prevent a thermal overshoot. When the thermal limit is exceeded, the block ADAPTIVE THERMAL SHUTDOWN 236 attenuates the gate voltage signal from the block HIGH SIDE DRIVER ENABLE 212 to the power MOSFET. After the load current falls below the current threshold, the block ADAPTIVE THERMAL SHUTDOWN 236 returns the thermal limit to the maximum thermal limit, and again allows the control of the gate voltage output from the block HIGH SIDE DRIVER 212 to be controlled by the signal at the input 252. Adapting the thermal maximum limit in high load current conditions slows the rate of thermal increase of the power MOSFET and protects the power MOSFET from damage that might occur due to thermal overshoot. Thermal overshoot can occur if the temperature increase exceeds a threshold before a thermal shutdown can protect the MOSFET. By adapting the thermal limit using the current sensors, the gate voltage is of the power MOSFET is modulated to reduce the rate of increase in temperature at the power MOSFET, which in turn reduces or eliminates thermal overshoot.

Figure 3:
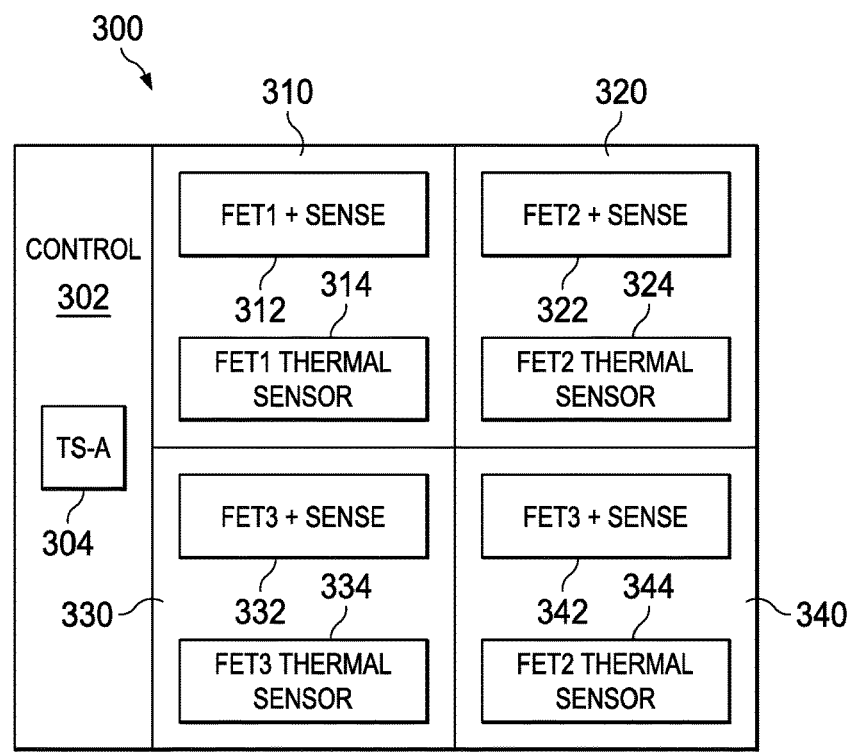
FIG. 3 is an example block diagram layout of an example arrangement of a four-channel high side driver with thermal protections.

FIG. 3 is an example block diagram layout of an example arrangement including a four-channel HSD device with thermal protections. In the example block diagram layout of FIG. 3, an HSD 300 with multiple switches is protected from fast transient thermal stress. HSD 300 has five blocks: CONTROL 302, and four switch channels 310, 320, 330 and 340. Within each of the four switch channels, 310, 320, 330 and 340, is a power MOSFET and sense circuit (FET1+SENSE 312, FET2+SENSE 322, FET3+SENSE 332 and FET4+SENSE 342) and a corresponding thermal sensor (FET1 THERMAL SENSOR 314, FET2 THERMAL SENSOR 324, FET3 THERMAL SENSOR 334 and FET4 THERMAL SENSOR 344). CONTROL 302 has an ambient thermal sensor, TS-A 304, plus other current and thermal controls (not shown). The block diagram layout of FIG. 3, although not to scale, shows a relative physical separation between the TS-A 304 and the individual channel thermal sensors FET1 THERMAL SENSOR 314 through FET4 THERMAL SENSOR 344. The physical layout of the five thermal sensors enables the differential temperature test described hereinabove for each of the four channels. Additional ambient thermal sensors are not needed for this arrangement or for other example arrangements with two or more switch channels. In one arrangement, for the four switch HSD 300, when a single switch (in any one of the blocks 312, 322, 332, and 342) exceeds a delta thermal limit, the input signal is attenuated for at least the affected switch. For example, when the thermal difference between TS-A 304 and FET1 THERMAL SENSOR 314 exceeds the delta limit, the gate signal for the affected power MOSFET, FET1 TS 314, is modulated, or shutoff. This approach protects the power MOSFETs from fast transient thermal stress. In another arrangement, the thermal sensors 314, 324, 334, and 344 are used with a comparator to a reference threshold temperature, and if any of the FET devices in blocks 312, 322, 332, 342 has a temperature in excess of a threshold temperature, an over-temperature protection is provided which shuts down the affected switch device.

Figure 4A:
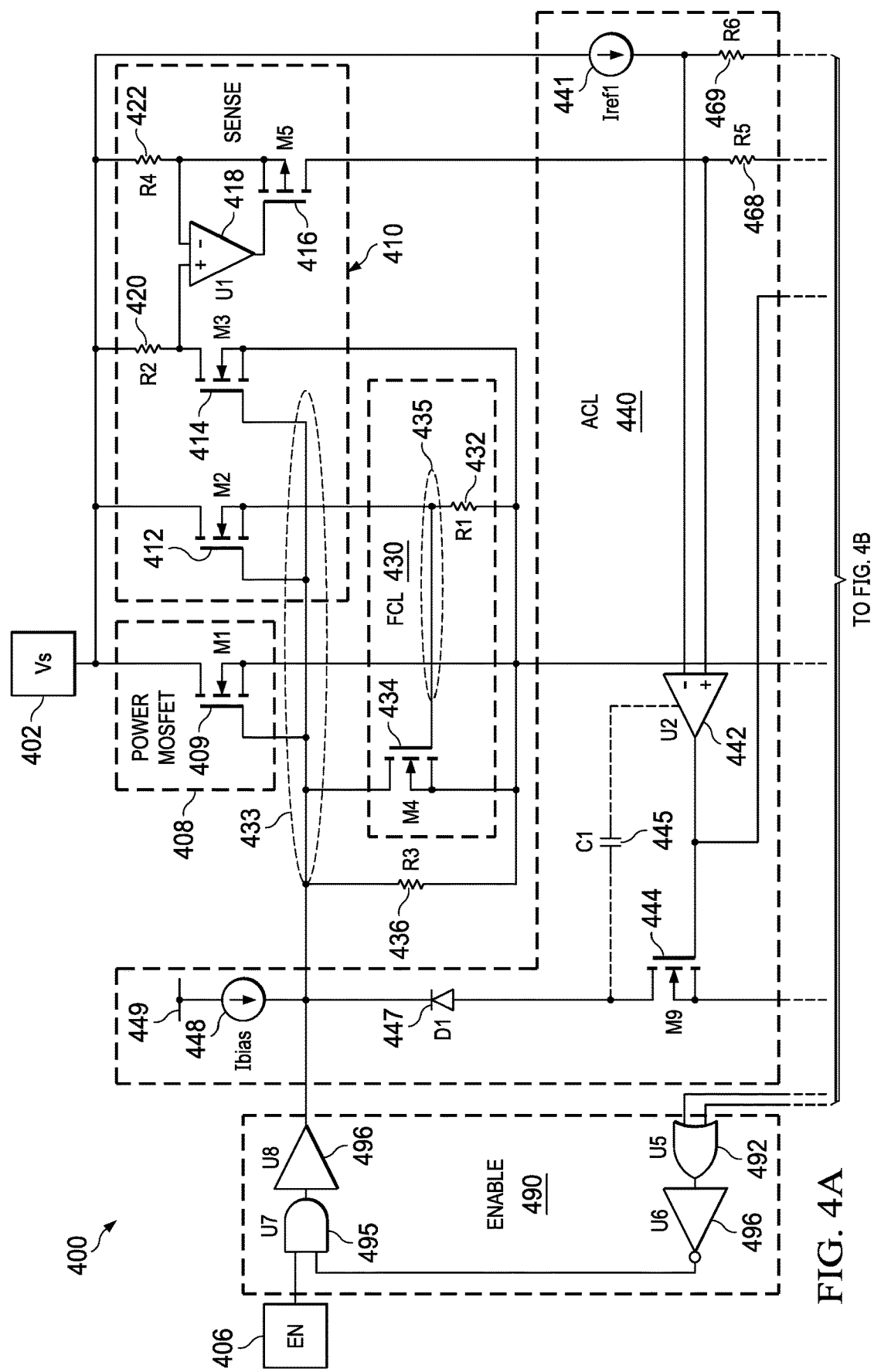
FIGS. 4A-4B are two portions of a schematic of an example single channel high-side driver device with thermal and current limit protection.
Figure 4B:
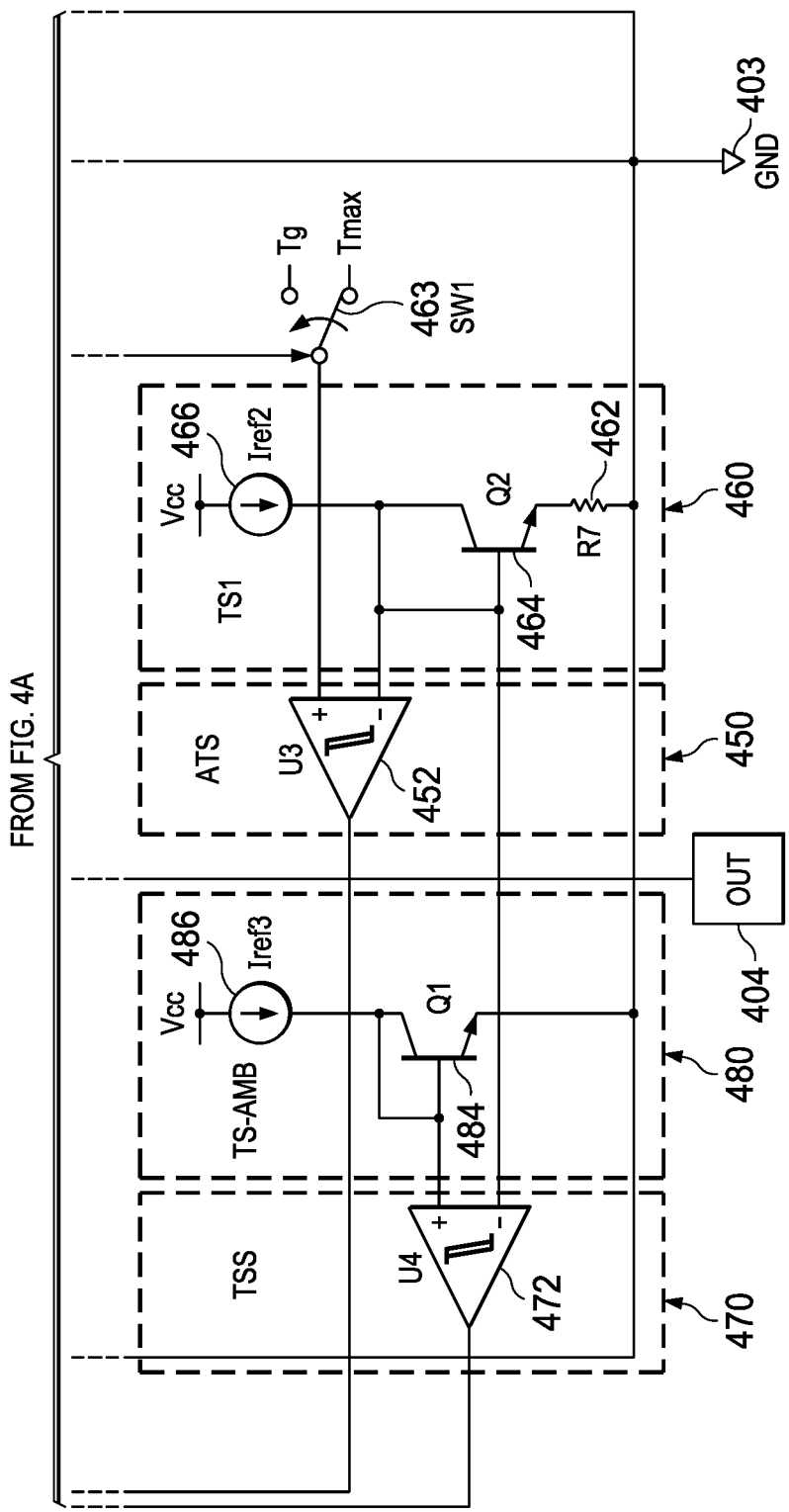

FIGS. 4A-4B are two portions of a schematic for an example single channel HSD 400 with thermal and current limit protections. In an example, the HSD 400 is implemented as a monolithic integrated circuit. The schematic in FIGS. 4A-4B has nine sections: POWER MOSFET 408; SENSE 410; FCL (fast current limit) 430; ACL (accurate current limit) 440; ATS (adaptive thermal shutdown) 450; TS1 (thermal sense for 1 channel) 460; TSS (thermal swing shutdown) 470; TS-AMB (thermal sense ambient) 480 and ENABLE 490. All the MOSFETS shown within the schematic of FIG. 4 are enhancement-mode devices. POWER MOSFET 408 includes transistor M1 409, in this example an N-channel power MOSFET. In the block SENSE 410 there are three MOSFETS: M2 412; M3 414 and M5 416. Transistor M5 416 is a P-channel MOSFET in this example. Also in SENSE 410 are two resistors, R2 420 and R4 422, and an operational amplifier U1 418. In the fast current limit section FCL 430 there is resistor R1 432 and MOSFET M4 434.

In SENSE 410 there is a current mirror including amplifier U1 418, transistor M3 414, and transistor M5 416 arranged in a feedback configuration. In the accurate current limit section ACL 440 there is a current source that outputs a reference current Iref1 441, a resistor R5 468, a resistor R6 469, an operational amplifier U2 442, a MOSFET M9 444, a capacitor C1 445, a diode 447, a current source Ibias 448. Ibias 448 is coupled to a voltage rail 449. In an example, a charge pump (not shown) located on the integrated circuit that implements HSD 400 can provide the voltage at the voltage rail 449. In an example, the charge pump increases the supply voltage such as a supply voltage coupled to terminal Vs to form the voltage at voltage rail 449. Because the power MOSFET M1 409 is a device with a low Rdson resistance, during operation the voltage at the output terminal OUT, coupled to the source of transistor M1 409, will be close to the supply voltage Vs, coupled to the drain. To ensure the power MOSFET M1 409 turns on completely, the gate voltage for transistor M1 409 at control node 433 must be higher than the voltage at the output terminal OUT by a voltage threshold margin. The voltage at voltage rail 449 is increased above the supply voltage Vs and is supplied by the bias current source Ibias 448 to control node 433 and to the gate terminal of M1 409.

In the adaptive thermal shutdown section ATS 450 there is a hysteresis comparator U3 452. In section TS1 460 there is a thermal sensor including resistor R7 462, a diode connected NPN transistor Q2 464 and a current source Iref2 466. In the thermal swing shutdown section TSS 470 there is another hysteresis comparator 472. In the thermal sense ambient section TS-AMB 480 there is a diode connected NPN transistor Q1 484 and a current source Iref3 486. In the enable section ENABLE 490 there is an OR GATE U5 492, inverter U6 493, AND gate U7 495 and buffer U8 496. Also included in the schematic of FIG. 4 are switch SW1 463, resistor R3 436, an enable terminal EN 406 and voltage supply terminal Vs 402, a ground terminal GND 403, and an output terminal OUT 404.

The terminal Vs 402 receives a supply voltage. Terminal Vs 402 is coupled to the drain terminals of transistors M1 409, M2 412 and to the first terminals of resistor R2 420, R4 422 and the current source Iref1 441. The terminal GND 403 is for receiving a ground potential. Terminal GND 403 is coupled to the second terminal of resistors R6 469, R5 468, and R7 462; and GND 403 is coupled to the emitter terminal of Q1 484 and to the source terminal of M9 444. The output terminal OUT 404 is coupled to the source terminals of transistors M1 409, M4 434, M3 414 and to the second terminals of R3 436 and R1 432. A terminal for receiving an input signal that enables the power MOSFET, EN 406, is coupled to the first input terminal of the AND gate U7 495 in the ENABLE section 490. The second terminal of the AND gate U7 495 is coupled to the output of inverter U6 493. The output of U7 495 is coupled to the input of buffer U8 496. The output of U8 496 is coupled to the anode of D1 447, the second terminal of current source Ibias 448, the first terminal of R3 436, the drain of M4 434 and the gate terminals of M1 409, M2 412 and M3 414. The current source Ibias 448 input terminal is coupled to the voltage at voltage rail 449 and the current source Ibias 448 output is coupled to the anode of D1 447. The second terminal of resistor R2 420 is coupled to the non-inverting input of U1 418 and to the drain of M3 414. The second terminal of resistor R4 422 is coupled to the inverting input of U1 418 and the source terminal of M5 416. The output terminal of U1 418 is coupled to the gate of M5 416. The drain terminal of M5 416 is coupled to the non-inverting input of U2 442 and the first terminal of R5 468. The output of Iref1 441 is coupled to the inverting input of U2 442 and the first terminal of R6 469. The output of U2 442 is coupled to the gate terminal of M9 444. A Miller capacitance C1 445 is shown between the drain and gate of MOSFET M9 444. The cathode of D1 447 is coupled to the drain terminal of M9 444. The output of OR GATE U5 492 is coupled to the input of inverter U6 493. The first input of U5 492 is coupled to the output terminal of comparator U3 452. The second input terminal of U5 492 is coupled to the output terminal of hysteresis comparator U4 472. The input terminal of Iref3 486 is coupled to the internal voltage reference Vcc. The output of current source Iref3 486 is coupled to the collector and base of Q1 484 and the non-inverting input of hysteresis U4 472. The input terminal of Iref2 466 is coupled to internal voltage reference Vcc. The output terminal of Iref2 466 is coupled to the collector and base of Q2 464, the inverting terminal of comparator U3 452 and inverting terminal of hysteresis comparator U4 472. The emitter terminal of the transistor Q2 464 is coupled to the first terminal of R7 462. The common terminal of SW1 463 is coupled to the non-inverting input of comparator U3 452. Tmax is the normally closed position of SW1 463 and Tg is the normally open position of SW1 463. The output of U2 442 is coupled to SW1 463 and controls switch SW1 463, causing the temperature limit to switch between Tmax and Tg.

In operation, the supply voltage is coupled at terminal Vs 402, and current and voltage are supplied by MOSFET M1 409 to a load (not shown) that is coupled at terminal OUT 404. The current is supplied responsive to a signal at the gate terminal of M1 409 at control node 433. Internally, a charge pump voltage or other reference voltage is provided at voltage rail 449, and the positive supply voltage Vs is provided at the terminal Vs 402. In an example arrangement, the supply voltage can be provided at terminal Vs 402 by a battery. In another arrangement, the voltage at terminal Vs can be provided by at internal voltage supply or by another external voltage source. M1 409 is an N-channel enhancement type power MOSFET. In an example, M1 409 is scaled to be 2500× larger than transistors M2 412 and M3 414. The width to length ratio (W/L) of M1 409 is much larger than for the other transistors in the circuit, for example, at least 100× larger than the width to length ratio W/L for the other transistors. Scaling M1 409 to other sizes creates additional arrangements. When the gate terminal of transistor M1 409 is at the same voltage potential as the source terminal, then M1 409 is in cutoff (because the gate to source voltage Vgs is less than a threshold voltage Vt for M1 409), so that no current flows through M1 409. Driving the gate terminal of M1 409 to a voltage potential greater than the source terminal by at least the threshold voltage will turn on M1 409. When transistor M1 409 is turned on, current flows from the drain terminal coupled to the terminal Vs 402 to the source terminal coupled to the output terminal OUT 404. The current through transistor M1 409 is also supplied to a load coupled to the output terminal OUT 404, and is equal to the load current supplied by the arrangement shown in FIG. 4. Transistors M2 412 and M3 414 are N-channel enhancement type MOSFETS and are located close to M1 409 and are proportional current mirrors. The currents in M2 412 and M3 414 are smaller than, and proportional to, the current flowing in M1 409. M1 409 is physically larger, having a width scaled by a factor such as 100× to 5000× larger than a nominal transistor on the IC. Because the power MOSFET M1 409 may be 100s of times larger than the current mirror MOSFETS M2 412 and M3 414, the currents flowing in MOSFETS M2 412 and M3 414 are scaled. This allows smaller device sizes for transistors M2 and M3 than for the power MOSFET M1, and saves silicon area and power. The gate terminals of M1 409, M2 412 and M4 414 are coupled to control node 433. The gate terminal of M4 434 is coupled to node 435.

Thermal sensor TS-AMB 480 includes current source Iref3 486 driving a constant current through an NPN transistor Q1 484. Transistor Q1 484 is configured as a diode with the base and collector coupled together. This arrangement is known to produce a linear voltage that is inversely proportional to the temperature (IPTAT). Transistor Q1 484 is located away from M1 409 on the integrated circuit so that the temperature dependent voltage output by Q1 484 represents the ambient chip temperature of the integrated circuit. Thermal sensor TS1 460 is formed by the current source Iref2 466 driving a constant current through Q2 464 which is also configured as a diode with the base and collector coupled together. Q2 464 forms an IPTAT temperature sensor. Current flowing into R7 462 creates an offset voltage corresponding to a desired temperature limit, such as 60 degrees Celsius. As described hereinabove, this arrangement is known to produce a linear voltage inversely proportional to the temperature. In an arrangement, transistor Q2 464 is located on the integrated circuit physically close to the power MOSFET M1 409 so that the temperature of Q2 464 represents the temperature of M1 409. Current sources Iref3 486 and Iref2 466 are matched to each other, and the transistors Q1 484 and Q2 464 are matched to each other. The device matching results in thermal sensors with uniform temperature gradients so that the two sensed temperatures can be accurately compared to one another. The voltage across Q2 464 will fall approximately linearly as temperature of the M1 409 MOSFET increases.

In normal temperature and current operation, the enable signal coupled to the terminal EN 406 controls the gate terminal of the power MOSFET M1 409 through the AND gate labeled U7 495. The output of the AND gate U7 495 is coupled to buffer U8 496 and then coupled to control node 433. In normal operation, when the signal at terminal EN 406 is high, the output of U8 496 is high. This high voltage allows the current source Ibias 448 to assert a high voltage from voltage rail 449 on the gate terminal of M1 409 by creating a gate voltage using the current flowing through resistor R3 436.

Current from current mirror M2 412 creates a voltage across R1 432 in the fast current limit section FCL 430 at node 435. Node 435 is coupled to the gate terminal of M4 434. M4 434 is arranged to couple the gate voltage of M1 409 to the source terminal of M1 409 which attenuates or shuts off M1 409 current. In normal current conditions, the voltage at node 435 does not enable M4 434 to conduct, allowing control node 433 to respond to the signal input on terminal EN 406.

In SENSE 410, a load current sensing circuit senses the current flowing through M1 409. The load current sense circuit includes a current mirror formed by transistor M3 414, a resistor R2, an operational amplifier U1 418 and a resistor R4 422 with the output of the operational amplifier controlling transistor M5 416. A feedback circuit with operational amplifier U1 418 sets the current through R4 422 to be equal to the current through R2 420 by changing the current using the gate of P-MOS transistor M5. This scaled current is proportional to the load current flowing through M1 409. The accurate current limit section ACL 440 will use the scaled sensed current flowing through R5 468 to provide a current limit clamping protection, as is further described hereinbelow.

The fast current limit section FCL 430 acts to prevent the load current from exceeding an absolute current limit. Resistor R1 432 and transistor M4 434 provide a fast current limit circuit. Current (scaled proportionally to the current flowing in M1 409 by the current mirror transistor M2 412) flowing in resistor R1 432 causes a voltage on resistor R1 432. When this scaled current is sufficiently large the voltage developed across resistor R1 432 can turn on transistor M4 434, which couples the gate terminal for M1 409 to the source terminal of transistor M1 409, shutting down the power MOSFET M1 409. The fast current limit section FCL 430 circuit acts very fast to turn off transistor M1 409 and therefore reduces or eliminates the possibility of damage to the MOSFET 409 due to a sudden increase in load current. This increase in current occurs during a short where the output terminal OUT 404 is grounded, or in the presence of a sudden inrush current, such as when a load is initially powered up or has a fault that causes a sudden current increase.

The accurate current limit section ACL 440 provides an accurate current limit that can be adjusted using a reference. Operational amplifier U2 442 compares the voltages set by resistor R6 469 and the reference current from current source Iref1 to the voltage across R5 468 due to the sensed scaled load current from M5 416 in SENSE 410. In operation at normal current conditions, the current that flows through R5 468 is less than the current limit so the output of U2 442 remains low, because the voltage at the first terminal R6 469 is higher than the voltage at the first terminal of resistor R5 468. When the output of U2 442 is low, the N-type MOSFET M9 444 is in cutoff, which allows the input signal at terminal EN 406 to control node 433. In addition, when the output of U2 442 is low, the switch SW 463 is set to the "Tmax" voltage reference, the higher temperature limit. When the scaled load current flowing through resistor R5 468 exceeds the reference current flowing Iref1 from current source 441 through resistor R6 469, the operational amplifier U2 442, which is configured as a comparator, turns on and the output turns on M9 444, pulling the voltage at control node 433 low. This control node 433 is coupled to the gate terminal of the power MOSFET M1 409, reducing the current flowing through M1 409, and thus providing a current limiting protection. Also, when the current reaches the limit current, the switch SW1 463 is moved to the lower temperature maximum setting Tg, a guardband temperature, as is further described below.

The adaptive thermal shutdown section ATS 450 provides a thermal shutdown protection that adapts to load current conditions. Comparator U3 452 compares the voltage output of temperature sensor TS1 that senses the temperature of power MOSFET transistor M1 409 to a temperature limit voltage from SW1 463. TS1 460 supplies a voltage corresponding to the temperature of M1 409 and SW1 463 provides a voltage corresponding to a temperature limit. Resistor R7 462 creates a voltage corresponding to an offset temperature, such as 60C which is used for a thermal swing comparison. The offset creates a limit used in the differential temperature comparisons. The switch SW1 463 selects between the temperature limits Tmax and Tg which are adjusted for the offset. Under normal operating temperatures, M1 409 is operating at a temperature lower than the temperature limit supplied by SW1 463, resulting in the output of U3 452 being low. When the temperature of M1 409 increases, the voltage at the temperature sensor formed by Q2 464, an NPN transistor that is diode connected, falls because it is an IPTAT (inversely proportional to absolute temperature) sensor. When the temperature of M1 409 falls below a limit set by switch SW1 (which is a voltage selected from Tmax or Tg as described further hereinbelow), the comparison becomes true, and the output of U3 becomes high, which is inverted by inverter U6 493 and reduces the voltage at the gate of transistor M1 409.

The thermal swing shutdown section TSS 470 provides a comparative thermal shutdown protection. Comparator U4 472 compares the difference between a voltage corresponding to the temperature of M1 409 (from TS1 460) with the voltage from TS-AMB 480 that corresponds to the ambient temperature of the IC. TS1 460 supplies the voltage corresponding to the temperature of M1 409 plus an offset from R7 462. TS-AMB 480 supplies the voltage corresponding to the ambient temperature of the IC. In normal operating conditions, the temperature difference between M1 409 and the ambient temperature of the IC is less than the offset temperature, resulting in the output of hysteresis comparator U4 472 being low.

In normal operation, the outputs of comparators U3 452 and U4 472 are low, accordingly the output of OR gate U5 492 will be low and coupled to inverter U6 493. The low U6 493 input results in a high output signal being coupled to the second input of AND gate U7 495. Note that in alternative arrangements, different logic gates can be useful, for example the combination of OR gate 492 and inverter 493 can be implemented as a NOR gate. NAND-NAND logic can also be used to combine the outputs of the hysteresis comparators 452, 472. In the arrangement of FIG. 4, with the second input of U7 495 in the high state, the first input, coupled to the EN signal on terminal EN 406, controls the output state of U7 495. The input at terminal EN 406 then controls the gate voltage of the transistor M1, which supplies current to the output terminal OUT in response to the gate voltage.

In the case of a fast rising load current, the fast current limit section FCL 430 protects the power MOSFET transistor M1 409 from thermal stress. In the example circuit FIG. 4, in the event of a fast-rising current edge, current mirror M2 412 rapidly conducts current proportional to the output current. The current through M2 412 flows through resistor R1 432 charging node 435. Node 435 is connected to the gate terminal of transistor M4 434 and the resulting increasing voltage on node 435 turns on transistor M4 434, which shorts control node 433 to the source terminal of M1 409, resulting in M1 409 turned off or the current through transistor M1 409 being reduced. Because transistor M4 434 is much smaller than M1 409, M4 434 switches before M1 409 fully conducts the short circuit current, protection M1 409.

In addition to the fast current limit provided by the section FCL 430 in FIG. 4, an accurate current limit is provided by the accurate current limit section ACL 440. When the load current sensed by the voltage on resistor R5 increases beyond the limit set by the voltage due to current from the reference Iref1 441 flowing into resistor R6 469, the output of operational amplifier U2 442 goes high, transistor M9 444 conducts and drops the voltage of control node 433. The falling voltage of control node 433, which is coupled to the gate terminal of the power MOSFET M1 409, attenuates the current flowing through M1 409 or may eventually shut off M1 409. The voltage across R6 469 is due to the current from current source Iref1 441 and the voltage sets the threshold for the operational amplifier U2 442. The voltage across R5 468 is due to the scaled sensed current that flows through M5 416. Transistor M5 416 is a P-type MOSFET controlled by the output of operational amplifier U1 418 in a negative feedback loop. Because there is a virtual ground at the input of U1 418, the feedback loop works to balance the voltages at the inputs of the operational amplifier, and so the current flowing in R4 422 will be equal to the current flowing in R2 420, forming the sensed current. By adjusting the current from Iref1, the accurate current limit threshold can be adjusted. When M1 409 is at the accurate current limit, the load current is clamped to not exceed the limit.

The thermal swing shutdown section TSS 470 prevents a thermal overshoot condition. Comparator U4 472 is a hysteresis comparator. U4 472 compares voltages corresponding to two temperatures and provides thermal overshoot protection for M1 409. The primary thermal energy in a HSD circuit is created when the power MOSFET, M1 409 in this example, conducts a large current. The power converted to heat is proportional to the load current squared. The heat radiates away from the power MOSFET to cooler parts of the IC and the IC package. Detecting and reducing a large temperature gradient between the power MOSFET and the remaining bulk of the IC can prevent thermal overshoot by reducing the load current before a thermal shutdown can occur, and thus extend the life of the power MOSFET. In the example HSD 400, a high temperature differential between M1 409 as sensed by the TS1 460 and the ambient IC temperature as sensed by TS-AMB 480 causes the output of U4 472 to go high. The output of OR gate U5 492 then goes high. U5 492 is coupled to inverter U6 493 which outputs a low signal. The output of inverter U6 493 is coupled to an input of AND gate U7 495. The low input signal to U7 495 causes control node 433 to be low. The low at control node 433 is coupled to the gate terminal of M1 409 and attenuates the current flow or shuts off the power MOSFET M1 409, which slows the rate of temperature rise. In an example, the resistor R7 462 provides the offset temperature, which in an example is 60 degrees Celsius.

In an arrangement, following a shutdown caused by the TSS 470, and after the temperature gradient falls through a reduced temperature gradient, the power MOSFET M1 409 can again start conducting providing an automatic restart. The comparator U4 472 is a hysteretic comparator so that the output goes low after the input from TS1 falls by a voltage corresponding to a temperature such as 10 degrees Celsius. For example, if the trigger value for the thermal swing sensor is 60 degrees Celsius, the recovery value is 50 degrees Celsius, that is 60-10 degrees. The output of the comparator U4 472 goes low, and the output of the buffer U6 493 in the enable section ENABLE 490 also goes low, enabling the power MOSFET M1 409 to turn on again. Automatic restart can support mission critical loads by not requiring a lengthy reset procedure to restart the power MOSFET powering the load. An example application is a power MOSFET supplying a battery voltage and current to an automotive headlamp.

In the arrangement of FIG. 4, another thermal protection is provided by automatic switching between a maximum temperature limit, Tmax, and a guard band temperature limit, Tg, using SW1 463. Switching to a lower temperature limit Tg in high load current conditions reduces stress on M1 409 that might occur due to thermal overshoot by reducing current through the device M1 409 prior to a thermal shutdown. Operational amplifier U2 442 in the accurate current limit section ACL 440 determines the maximum temperature limit by switching SW1 463 between the absolute max temperature Tmax and a guard band temperature limit Tg when the load current reaches a maximum set limit current. Operational amplifier U2 442 compares the voltage across R5 468 to the voltage across R6 469. When the voltage across R5 468 is greater than the voltage across R6 469, indicating the output current is at the limit, then the output of U2 442 goes to a high state. The high output on U2 442 switches SW1 463 to the guard band temperature limit Tg. This may be a voltage corresponding to a temperature 10 degrees less than the maximum temperature. For example, the maximum temperature may be 175 degrees Celsius, while the guard band temperature limit Tg may be 165 degrees Celsius.

In the example of FIGS. 4A-4B, the comparator U3 452 in ATS 450 is also a hysteretic comparator. This comparator will also allow an automatic restart. For example, if the temperature sensor TS1 indicates the temperature of the power MOSFET M1 409 exceeds the limit temperature indicated by switch SW1 463, the output of U3 will go high, and the output of inverter U6 493 in the ENABLE section 490 will go low, turning off or attenuating the gate voltage at control node 433 for power MOSFET M1 409. Once the voltage output by the temperature sensor TS1 460 falls below a hysteretic limit, the output of U3 will go to zero, the output of the inverter U6 493 will change to a logic high, and the power MOSFET M1 409 will be allowed to turn on again in an automatic restart. Use of the hysteretic comparators U3 452, U4 472 prevents "chatter" where the power MOSFET M1 409 is rapidly turned on and off by causing a "wait" period to allow the device to cool before the restart occurs. In an example, the comparator U3 452 will allow the MOSFET M1 409 to restart after the temperature from TS1 460 falls to a temperature that is 10 degrees below the temperature Tmax or Tg that is selected. In an example, if Tmax is used, it may be 175 degrees Celsius, in which case the recovery temperature for restarting normal operation may be 165 degrees Celsius. In another example, if Tg is used due to the operation of switch SW1, the selected temperature may be 165 degrees Celsius, and the recovery temperature for restart might be 155 degrees Celsius.

In the example of FIG. 4, several current limit protection circuits and thermal overshoot protections are provided for a single channel HSD IC. However, in additional arrangements, some of the features described hereinabove, but not necessarily all of the features, can be provided on an IC including a power MOSFET. For example, the use of an adaptive thermal limit as provided by the use of ATS 450 and switch SW1 with the comparator 442 can be used. In another example, the comparison of the temperature of the power MOSFET in a high side driver to the bulk IC temperature can be used; this function is provided by the comparator U4 472 in the thermal swing shutdown section TSS 470, with the thermal sensors TS1 and TS-A in FIG. 4. In yet another example, the rapid current limit provided by the section FCL 430, using transistors M2 412, resistor R1 432, and transistor M4 434, can be used. In still another example, the accurate current limit provided by the accurate current limit section ACL 440 can be used. These protection features can be combined to form the example arrangement of FIG. 4, however in alternative arrangement any one or more of the protective features of the arrangements such as the rapid current limit, the adaptive thermal sensing, the differential thermal sensing, or the accurate current limit, can be used to protect a power MOSFET coupled between a supply voltage and an output terminal from overcurrent and thermal overshoot conditions. In addition, the implementation of FIG. 4 is for a single channel example with one power MOSFET M1 409. However, as shown in the block diagram of FIG. 3, the arrangements can be used to form multiple channels. In a multiple channel example, the ambient temperature sensor TS-AMB 480 can be shared among the channels, the remaining sections of FIG. 4 would be repeated for the multiple channels.

Figure 5:
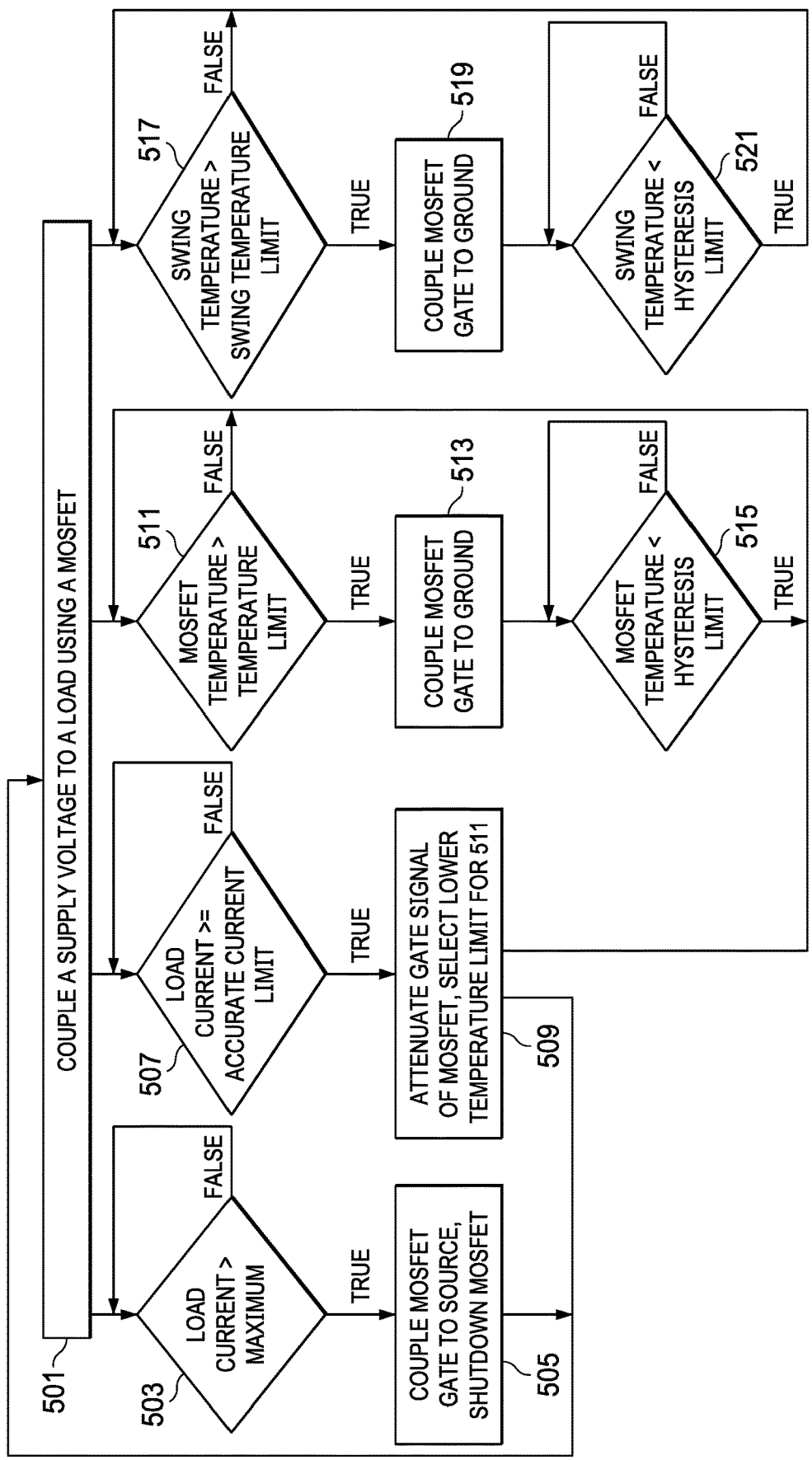
FIG. 5 is a flowchart of an example method for providing thermal and current limit protections for a MOSFET supplying current to a load.

FIG. 5 illustrates in a flowchart a method for operating a MOSFET coupled between a supply voltage and an output terminal coupled to a load with thermal protection and current limiting. In FIG. 5, the method begins at step 501. At step 501 the MOSFET is enabled by a signal at a gate terminal to couple a voltage supply at a supply terminal to an output terminal where a load is coupled to receive current. For example, in FIG. 4, the power MOSFET M1 409 is coupled to supply current from the voltage supply at the terminal Vs 402 to the output terminal OUT 404, with the signal at the enable terminal EN 406 coupled to the gate of the power MOSFET M1 409.

The method in FIG. 5 then transitions to several overcurrent and thermal protection processes that operate in parallel. Note that each of the four decision blocks 503, 507, 511 and 517 represent a parallel protection process that is operating to protect a power MOSFET. In an alternative arrangement, one or more of the protections shown as 503, 507, 511 and 517 can be omitted while the remaining protections are used to improve overall system performance.

In FIG. 5, the decision block 503 corresponds to the fast current limit, such as implemented by section FCL 430 in FIG. 4. In decision block 503, the load current is compared to a maximum limit. This function is performed by the current mirror transistor M2 412 in FIG. 4 and resistor R1 432. The current flowing into R1 results in a voltage that can turn on transistor 434 if the voltage (proportional to the load current) reaches a threshold for the transistor 434. As shown in FIG. 5 the decision block 503 is continuously operating, that is, when the condition is false "FALSE" at block 503, a loop continues to repeat block 503. As long as the power MOSFET is supplying current to the load, the fast current limit function is operating. In contrast, when the decision at block 503 is true "TRUE", the condition is met and the method transitions to block 505. At block 505, the fast current limit process couples the gate of the power MOSFET, such as M1 409 in FIG. 4, to the source which is also coupled to the output terminal OUT. In the example shown in FIG. 4, the transistor M1 434 turns on when the current flowing in resistor R1 432 causes a voltage on the gate of transistor M4 to exceed a threshold voltage for M4 434. Transistor M4 434 couples the gate at control node 433 in FIG. 4 to the source of the power MOSFET M1 409 and to the output terminal OUT 404. The operation of the fast current limit reduces the gate to source voltage at M1 409, reducing the load current. By coupling the gate to the source, the power MOSFET M1 409 is attenuated or turned off (because the gate to source voltage Vgs is reduced. If the gate voltage becomes equal to or very near the source voltage, the gate to source voltage will be less than the threshold voltage for M1 409 and the device may turn off. The current into R1 432 will then fall, the limit is no longer met and M1 409 can then again start supplying current to the load.

In FIG. 5, the method continues by returning to step 501, and returning the control of the power MOSFET to the enable signal. Block 507 represents the accurate current limit process. Note that the four decision blocks 503, 507, 511, 517 represent protection processes that operate in parallel, even though the operations are described one at a time herein. In FIG. 4, the process in decision block 507 is performed by U2 442. As shown in FIG. 5, a determination is made in decision block 507 whether the load current is greater than or equal to a limit current. In an implementation of this decision block, a first reference voltage is developed using a current source (for example Iref1 441 in FIG. 4) and a sense resistor (for example R6 469 in FIG. 4). The operational amplifier U2 compares the voltage across resistor R6 to the voltage across the resistor R5 468. The sensed current into resistor R5 468 is proportional to the load current and is provided by transistor M5, coupled as a scaled load current sensor. When the voltage across R5 468 exceeds the reference voltage across R6 469, the output of operational amplifier U2 452 transitions, indicating the load current exceeds a current limit.

In FIG. 5, when the condition is met in block 507, the method transitions using the "TRUE" branch to block 509, where the gate signal to the power MOSFET is reduced. This process is performed, for example, by using an additional MOSFET having a gate signal coupled to the output of a comparator, such as MOSFET M9 444 in FIG. 4, which receives the output of operational amplifier U2 442 at the gate. The MOSFET M9 444 is coupled between the gate terminal of the power MOSFET M1 409 and a ground terminal such as GND 403 in FIG. 4. By reducing the gate voltage at the power MOSFET M1 409, the current flowing to the load is reduced. The output of U2 442 also performs an additional function as shown in block 509, which is that the temperature limit is changed to a lower limit. Switch SW1 463 in FIG. 4 selects a lower temperature limit when the output of the operational amplifier U2 442 changes state.

As shown in FIG. 5, when the process at block 509 is complete, the method returns to step 501 and continues. Once the load current is reduced, the output of U2 will transition back to the original state until the load current again reaches the accurate current limit.

Returning to FIG. 5, another protection process is shown at block 511. In block 511, a thermal protection process begins with a decision. The temperature of the power MOSFET M1 409 is compared to a temperature limit. The temperature sensed can include an offset. Further the temperature limit can be adaptively adjusted to a lower temperature limit in high load current conditions. Reducing the limit temperature in high load current conditions prevents or reduces a thermal overshoot where the power MOSFET temperature rises above a desired temperature limit before the current can be reduced.

The decision block 511 in FIG. 5 compares a temperature corresponding to the temperature of the power MOSFET device (M1 409 in the example of FIG. 4) to a limit. This process is performed, for example, by the comparator U3 452 in FIG. 4. Using a temperature sensor that corresponds to the device temperature of power MOSFET such as M1 409 in FIG. 4, the decision block 511 determines whether the temperature exceeds a limit temperature. An example temperature sensor is TS1 460 in FIG. 4. If the comparison in block 511 is true, as shown by the branch "TRUE" at decision block 511 in FIG. 5, the method continues to block 513, where the gate of the power MOSFET is coupled to ground to stop the load current flow (and thereby reduce the device temperature.) For example, in FIG. 4 the output of comparator U3 452 is coupled through the OR gate U5 492 and an inverting buffer U6 493 to the AND gate U7 495, and through buffer U8 496. The output of the comparator U3 452 provides a low voltage at control node 433, which is coupled to the gate of the power MOSFET M1 409. The power MOSFET M1 409 thus begins turning off, reducing the current through the device, and causing device temperature to fall.

At the next block, 515, following block 513, the method continues by performing another decision. At block 515, the method tests whether the device temperature (which is provided by a thermal sensor such as TS1 460 in FIG. 4) is lower than a hysteresis temperature limit. This hysteresis temperature limit is provided by using a comparator that includes hysteresis. Once the comparator finds the initial temperature limit is met in block 511, it will continue to output a signal indicating the limit is met until the device temperature falls through and is less than a second lower limit, the hysteresis limit. This can be implemented, for example, by using a comparator with a hysteresis feature such as U3 452 in FIG. 4. The use of the hysteresis comparator prevents rapid turning off and on of the power MOSFET in a chatter condition. Instead, the method at block 513 waits for the power MOSFET device to cool before turning it on again after the hysteresis limit is reached. In an example, a thermal limit may be 175 degrees Celsius, with a 10 degree hysteresis limit, so that the power MOSFET has to cool to 165 degrees Celsius before an enable signal (for example the signal input at terminal EN in FIG. 4) is again allowed to turn the power MOSFET on. The output of the hysteresis comparator U3 452 is coupled to the control node 433 through the OR gate 495 U5 and the inverter 493 U6 in FIG. 4, for example. Once the output of the hysteresis comparator U3 is zero, because the device temperature has fallen, the AND gate U7 495 will again see a logical "one" at one input, allowing the enable signal at the enable terminal EN 406 to control the power MOSFET.

Note that the temperature limit in decision blocks 511 and 515 can be adaptively changed by the current limit process in block 509. This feature can be implemented, for example, using the switch SW1 463 in FIG. 4 to select a lower temperature limit when the load current is at or near a current limit. By lowering the temperature limit in high load current conditions, a thermal overshoot can be reduced or prevented because the MOSFET temperature limit to the comparator is now lower, causing the comparator to output a high signal earlier as the MOSFET temperature increases, and causing the reduction in the current flowing through the MOSFET device to begin at a lower limit temperature.

Returning to FIG. 5, the method includes another parallel thermal protection process represented by the decision block 517. At decision block 517, the swing temperature, that is a difference between the temperature of a power MOSFET device delivering current to a load and an ambient temperature of the integrated circuit including the MOSFET, is compared. If the MOSFET device temperature exceeds the ambient temperature by more than a limit, then a thermal protection process is performed. In FIG. 4, the block TSS 470 including comparator U4 472 implements the decision block 517. The comparator U4 572 has an ambient thermal sensor at one input. The ambient thermal sensor can be implemented by, for example, the thermal sensor TS-AMB 480 in FIG. 4. The other input receives the device thermal sensor input. In FIG. 4, the thermal sensor TS1 460 performs this function. Note that for the input to the comparator U4 472, there is an offset in the device temperature. In one example implementation, a resistor R7 462 adds a voltage to the output voltage of the transistor Q2 464, creating an offset. In one example, the offset corresponds to a temperature swing of 65 degrees Celsius. Other temperature differences can be used.

At decision block 517, when the comparison is false, the process simply returns and repeats. When the comparison in the decision block 517 is true, the method transitions to block 519, where the gate of the power MOSFET is coupled to ground. In FIG. 4, this process is implemented by that OR gate U5 592, the inverter U6 493, the AND gate U7 495, and the buffer U8 496. When the output of the hysteresis comparator U4 472 in FIG. 4 is high, the control node 433 which is coupled to the gate of the power MOSFET M1 409, is a low voltage, shutting off the power MOSFET device, and thereby reducing the device temperature.

In FIG. 5, the method then transitions to decision block 521. As described above with respect to block 515, in this decision block a hysteresis limit is used for a compare. The process remains in decision block 521 until the swing temperature is less than a hysteresis limit, which is a limit lower than the initial swing temperature limit. Using hysteresis in decision block 521 allows the power MOSFET to cool slightly before it is again enabled to deliver current to a load. In FIG. 4, this function is performed by the hysteresis comparator U4 472 which is a hysteresis comparator. In an example, the hysteresis limit can be a temperature about 10 degrees Celsius less than the swing temperature limit. Once the measured swing temperature falls below the hysteresis limit the condition in the decision block 521 is true as indicated by the "TRUE" branch from decision block 521, and the method returns to decision block 517 and repeats.

Modifications are possible in the described arrangements, and other additional arrangements are possible within the scope of the claims.

What is claimed is:

1. An apparatus, comprising:
a first metal oxide semiconductor field effect transistor (MOSFET) coupled between a first input terminal for receiving a supply voltage and an output terminal for coupling to a load, and having a first gate terminal;
an enable terminal coupled to the first gate terminal for receiving an enable signal;
a first resistor having an first terminal and having a second terminal coupled to the output terminal;
a first current mirror coupled between the first input terminal and the first terminal of the first resistor, and having an input coupled to the first gate terminal; and
a second MOSFET coupled between the first gate terminal and the output terminal, and having a second gate terminal coupled to the first terminal of the first resistor;
a second resistor having a first terminal, and having a second terminal coupled to a ground terminal;
a first current source coupled between the first input terminal and the first terminal of the second resistor;
a third resistor having a first terminal, and having a second terminal coupled to the ground terminal;
a second current mirror coupled between the first input terminal and the first terminal of the third resistor, the second current mirror having an input coupled to the first gate terminal;
a third MOSFET coupled between the first gate terminal and the ground terminal, and having a third gate terminal;
a first comparator having a first input coupled to the first terminal of the second resistor, having a second input coupled to the first terminal of the third resistor, and having an output coupled to the third gate terminal of the third MOSFET.

2. The apparatus of claim 1, including:
a first thermal sensor coupled to sense a temperature of the first MOSFET and having an output; and
a second comparator having a first input coupled to a voltage at a node corresponding to a limit temperature and having a second input coupled to the output of the first thermal sensor, and having an output coupled to the first gate terminal.

3. The apparatus of claim 2, in which the first comparator is a hysteresis comparator.

4. The apparatus of claim 3, in which the first thermal sensor includes:
a second current source coupled between a positive power supply terminal and a first diode connected bipolar transistor; and
a fourth series resistor having a first terminal coupled to the first diode connected bipolar transistor and having a second terminal coupled to the ground terminal.

5. The apparatus of claim 4, including:
a third comparator having a first input coupled to an ambient thermal sensor and having a second input coupled to the first thermal sensor, and having an output coupled to the first gate terminal.

6. The apparatus of claim 5, in which the ambient thermal sensor further includes a third current source coupled to the positive power supply terminal and to a first terminal of a second diode connected bipolar transistor having a second terminal coupled to the ground terminal.

7. The apparatus of claim 6 in which the second comparator is a hysteresis comparator.

8. The apparatus of claim 7, including a first logic gate coupled to the output of the first comparator and to the output of the second comparator, and having an output coupled to a first input of a second logic gate that has a second input coupled to the enable terminal, in which the second logic gate has an output coupled to the first gate terminal.

9. The apparatus of claim 8 in which the first logic gate is an OR gate.

10. The apparatus of claim 9 including an inverter between the output of the first logic gate and the input of the second logic gate.

11. The apparatus of claim 10 in which the second logic gate is an AND gate.

12. The apparatus of claim 1 in which the first MOSFET is a power MOSFET that has a first width to length (W/L) ratio that is at least 100 times greater than a second W/L ratio of the second MOSFET.

13. The apparatus of claim 1 in which the first current mirror includes a fifth MOSFET having a gate coupled to the first gate terminal, a drain coupled to the first terminal and a source coupled to the first series resistor.

14. The apparatus of claim 1 in which the first MOSFET is an n-type enhancement mode MOSFET.

15. An integrated circuit, comprising:
a supply terminal;
a load terminal;
an enable terminal;
a ground terminal;
a first metal-oxide-semiconductor field-effect-transistor (MOSFET) coupled between the supply terminal and the load terminal and having a first gate terminal coupled to the enable terminal;
a first resistor having a first terminal, and having a second terminal coupled to the load terminal;
a second MOSFET having a second gate terminal coupled to the first gate terminal, the second MOSFET coupled between the supply terminal and the first terminal of the first resistor; and
a third MOSFET coupled between the first gate terminal and the load terminal and having a gate terminal coupled to the first terminal of the first resistor;
a second resistor having a first terminal and having a second terminal coupled to the ground terminal;
a first current mirror coupled between the supply terminal and the first terminal of the second resistor;
a third resistor having a first terminal, and having a second terminal coupled to the ground terminal;
a first current source coupled to the supply terminal and having an output coupled to the first terminal of the third resistor;
an operational amplifier having a first input coupled to the second resistor and a second input coupled to the third resistor and having an output; and
a fourth MOSFET coupled between the first gate terminal and the ground terminal and having a third gate terminal coupled to the output of the operational amplifier.

16. The integrated circuit of claim 15 including:
a first thermal sensor coupled to sense a temperature of the first MOSFET;
a first switch coupled to select between a voltage corresponding to a first thermal limit and a second thermal limit less than the first thermal limit, and having a switch output; and
a first hysteresis comparator having a first input coupled to the first thermal sensor and a second input coupled to the switch output, and having an output coupled to the first gate terminal.

17. The integrated circuit of claim 16, including:
a second thermal sensor coupled to sense the temperature of the integrated circuit at a position spaced from the first MOSFET; and
a second hysteresis comparator having a first input coupled to the first thermal sensor, a second input coupled to the second thermal sensor, and an output coupled to the first gate terminal.

18. The integrated circuit of claim 15, in which the first MOSFET is a power MOSFET device that is an n-type enhancement node MOSFET transistor.

19. The integrated circuit of claim 15, in which the first MOSFET has a width over length (W/L) ratio that is greater than 100 times a W/L ratio of the second MOSFET.

20. The integrated circuit of claim 15 including an additional MOSFET coupled between the first terminal for receiving the voltage supply and to an additional output terminal for coupling to an additional load, and having a gate terminal coupled to an additional enable signal.

* * * * *